United States Patent
Cassetti et al.

(10) Patent No.: US 6,311,302 B1
(45) Date of Patent: Oct. 30, 2001

(54) METHOD AND ARRANGEMENT FOR HIERARCHICAL CONTROL OF MULTIPLE TEST ACCESS PORT CONTROL MODULES

(75) Inventors: David Cassetti, Tempe; James Steele, Chandler; Swaroop Adusumilli, Tempe, all of AZ (US)

(73) Assignee: Philips Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 09/283,648

(22) Filed: Apr. 1, 1999

(51) Int. Cl.[7] .................................................. G01R 31/28
(52) U.S. Cl. .............................. 714/727; 714/30; 714/726
(58) Field of Search .............................. 714/30, 720, 724, 714/726, 733, 727, 729; 370/241

(56) References Cited

U.S. PATENT DOCUMENTS

| | | | |
|---|---|---|---|
| 5,627,842 | * | 5/1997 | Brown et al. .......................... 714/727 |
| 5,708,773 | * | 1/1998 | Jeppesen, III et al. ................. 714/30 |
| 6,073,254 | * | 6/2000 | Whetsel ................................. 714/30 |

OTHER PUBLICATIONS

Whetsel, Lee, *An IEEE 1149.1 Based Test Access Architecture For ICs With Embedded Cores*, Texas Instruments.
IEEE Std 1149.1 *(JTAG) Testability Primer*, Texas Instruments, 1997 Semiconductor Group.
IEEE Std 1149.1–1990, *IEEE Std Test Access Port and Boundary–Scan Architecture*, IEEE Computer Society, Oct. 21, 1983.

* cited by examiner

*Primary Examiner*—Emmanuel L. Moise

(57) ABSTRACT

An arrangement controls an IC designed with multiple "TLM'ed core" circuits, such as multiple CPUs, with each core circuit including its own TAP controller and with multiple TAP controllers enabled a time. For applications typically requiring that control be transferred between such TAP controllers of various core circuits, one embodiment of the present invention expands a multiple "TLM'ed core" circuit design without changing the IEEE JTAG specification and without requiring more scan chains per TAP'ed core. One particular example embodiment includes each of the design's multiple cores including multiple test-access port (TAP) controllers, and including an internal TLM having a TLM register adapted to store a decodable instruction and a supplemental storage circuit adapted to store a coded signal. Also in the design, a chip-level TLM communicates with a common IEEE JTAG interface and with each of the multiple cores via the TLM register and the supplemental storage circuit. The chip-level TLM and the multiple cores signal use the supplemental storage circuit to indicate when instructions are to be transferred from a TLM'ed core to the chip-level TLM.

20 Claims, 2 Drawing Sheets

METHOD AND ARRANGEMENT FOR HIERARCHICAL CONTROL OF MULTIPLE TEST ACCESS PORT CONTROL MODULES

RELATED PATENT DOCUMENTS

This application relates to and is filed concurrently with U.S. patent applications, Ser. Nos. 09/283,809, entitled "Method And Arrangement For Controlling Multiple Test Access Port Control Modules," and Ser. No. 09/283,171, entitled "Method And Arrangement For Controlling Multiply-Activated Test Access Port Control Modules." Each of these applications is assigned to the same assignee and incorporated herein in its entirety.

FIELD OF THE INVENTION

The present invention relates generally to testing integrated circuits (ICs) and, more particularly, to IC test methods and arrangements involving multiple test access port controllers, such as used in connection with IEEE JTAG standards.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A wide variety of techniques have been used in IC devices to ensure that, once they are manufactured, they operate fully in compliance with their intended design and implementation specifications. Many of the more complex IC designs include circuits that permit in-circuit testing via the IC access pins. The IEEE 1149.1 JTAG recommendation, for example, provides a test circuit architecture for use inside such ICs. This architecture includes a test access port (TAP) controller coupled to the IC pins for providing access to and for controlling various standard features designed into such ICs. Some of these features are internal scan, boundary scan, built-in test and emulation.

The JTAG recommendation was developed with the understanding that such IC designs would be using only one test access port controller. Sometime after its initial development, however, many IC's are being designed with multiple "core" circuits, such as multiple CPUs, with each core circuit including its own TAP controller. Typically, separate IC pins are used to select one of the TAP controllers for testing and/or debugging the IC. This is problematic, however, in IC applications that require an increasing number of core circuits without increasing the circuit area of the IC and/or the number of IC pins.

One approach that attempts to overcome such difficulty involves use of an internally implemented circuit for selecting which of the TAP controllers is activated during a test/debug mode of operation inside the TAP controller itself. This approach requires a change to the existing structure of the TAP controllers so that special signals can be drawn from and fed to each TAP controller, and requires that each TAP controller have knowledge that it is enabled at a given time. For many applications, however, changing the design of the established TAP controller is expensive. Further, for certain applications, requiring that each TAP controller have knowledge that it is enabled at a given time adversely removes a desired degree of transparency.

For further information concerning with the above issues, reference may be made to an article entitled, "An IEEE 1149.1 Based Test Access Architecture for ICs with Embedded Cores," by Lee Whetsel, and to IEEE Std. 1149.1-1990, and 1149.1-1993, each of which is incorporated herein by reference.

Many IEEE JTAG applications involve a JTAG-specified feature referred to as "Scan Chain Control." Scan Chain Control has a variety of applications and is primarily directed to enhancing internal IC testing via signaling provided at the boundary of the IC. The above-referenced U.S. patent application, Ser. No. 09/283,171 (Docket No. VLSI.228PA) teaches using Scan Chain Control to transfer control from one TAP controller to another TAP controller, without the risk of destroying a current instruction in the instruction register of a TAP controller in communication with the TLM. This is accomplished using the Test Link Module (TLM) to pass a test instruction (e.g., TLM Select instruction) to the TAP controller as part of the step of transferring control.

One particular Scan Chain Control application is directed to ICs having multiple TLM'ed core circuits. In circuit designs of this type, each of multiple cores within the IC includes an internal TLM and multiple TAP controllers with coordination therefor provided by the TLM. A central control agent, such as a chip level TAP Link Module, selectively enables one or more of the TAP controllers in each core. Each of these blocks communicates with the standard JTAG Interface signaling (TDI, TDO, TCK, TMS and TRST). In accordance with aspects of the above-referenced U.S. patent application, Ser. No. 09/283,171(Docket No. VLSI.228PA), Scan Chain Control can be used to permit access to the Internal TLM modules by the TAP controllers. Depending upon the command loaded into the internal TLM register, the TLM module enables or disables various TAPs in a system by controlling TMS.

Transferring control as described above, however, is problematic for ICs having multiple TLM'ed core circuits. As the level of circuit integration grows, TLMed cores are expected to evolve with more signal processing and control features, just as embedded cores of today have evolved. For design reuse in such futuristic implementations, effectively accommodating such a design evolution would typically involve hierarchical expansion of TLM'ed cores with the hierarchy providing communication among the additional cores. One prior art approach addresses this issue by directly building hierarchical features directly into the TAP controllers. This, however, has required changes to the existing IEEE JTAG 1149.1 specification. This limits potential for core reuse and is therefore disadvantageous.

SUMMARY

According to various aspects of the present invention, embodiments thereof are exemplified in the form of methods and arrangements for controlling an IC designed with multiple TLM'ed core type circuits, such as multiple CPUs. In one example application, each core circuit includes its own TAP controllers and its own TLM, each consistent with the IEEE JTAG recommendation. This application is directed to a circuit control arrangement for a multicore IC having a limited number of access pins for selecting functions internal to the IC. Where control is to be transferred between such TAP controllers of various core circuits, one embodiment of the present invention expands a multiple "TLM'ed core" circuit design without changing the IEEE JTAG specification and without requiring more scan chains per TAP'ed core. This is accomplished using a TLM internal to each core with the TLM having a TLM register for storing decodable instructions and a supplemental bit storing a coded signal that indicates when an instruction is being passed from a TLM core.

One particular example embodiment includes each of a plurality of multiple cores including multiple test-access port (TAP) controllers, and including an internal TLM having a TLM register adapted to store a decodable instruction and a supplemental storage circuit adapted to store a coded signal. A chip-level TLM communicates with a common IEEE JTAG interface and with each of the multiple cores via the TLM register and the supplemental storage circuit. The chip-level TLM and the multiple cores signal via the supplemental storage circuit to indicate to the chip-level TLM when an instruction is being passed. Such instructions issued by one of the multiple cores to control other cores and to indicate when the TDI and TDO should be routed for one of the respective multiple cores.

In another particular example embodiment of the present invention, a multi-core IC has each of the multiple cores including at least one test-access port (TAP) controller. At least one of the multiple cores includes multiple test-access port (TAP) controllers and an internal TLM, wherein the internal TLM includes a storage unit has a TLM register adapted to store a decodable instruction and a supplemental storage circuit adapted to store a coded signal. Also in the IC, a chip-level TLM is communicatively coupled with a common interface and with each of the multiple cores via the TLM register and the supplemental storage circuit. The chip-level TLM and the cores are configured and arranged to use the supplemental storage circuit as described above. In another more specific implementation, at least one of the multiple cores includes a scan-chain support circuit, and the cores and chip-level TLM are further adapted to use the scan-chain support circuit for transferring instructions and control.

The above summary is not intended to provide an overview of all aspects of the present invention. Other aspects of the present invention are exemplified and described in connection with the detailed description.

BRIEF DESCRIPTION OF THE DRAWINGS

Various aspects and advantages of the present invention will become apparent upon reading the following detailed description of various embodiments and upon reference to the drawings in which.

Figure 1:
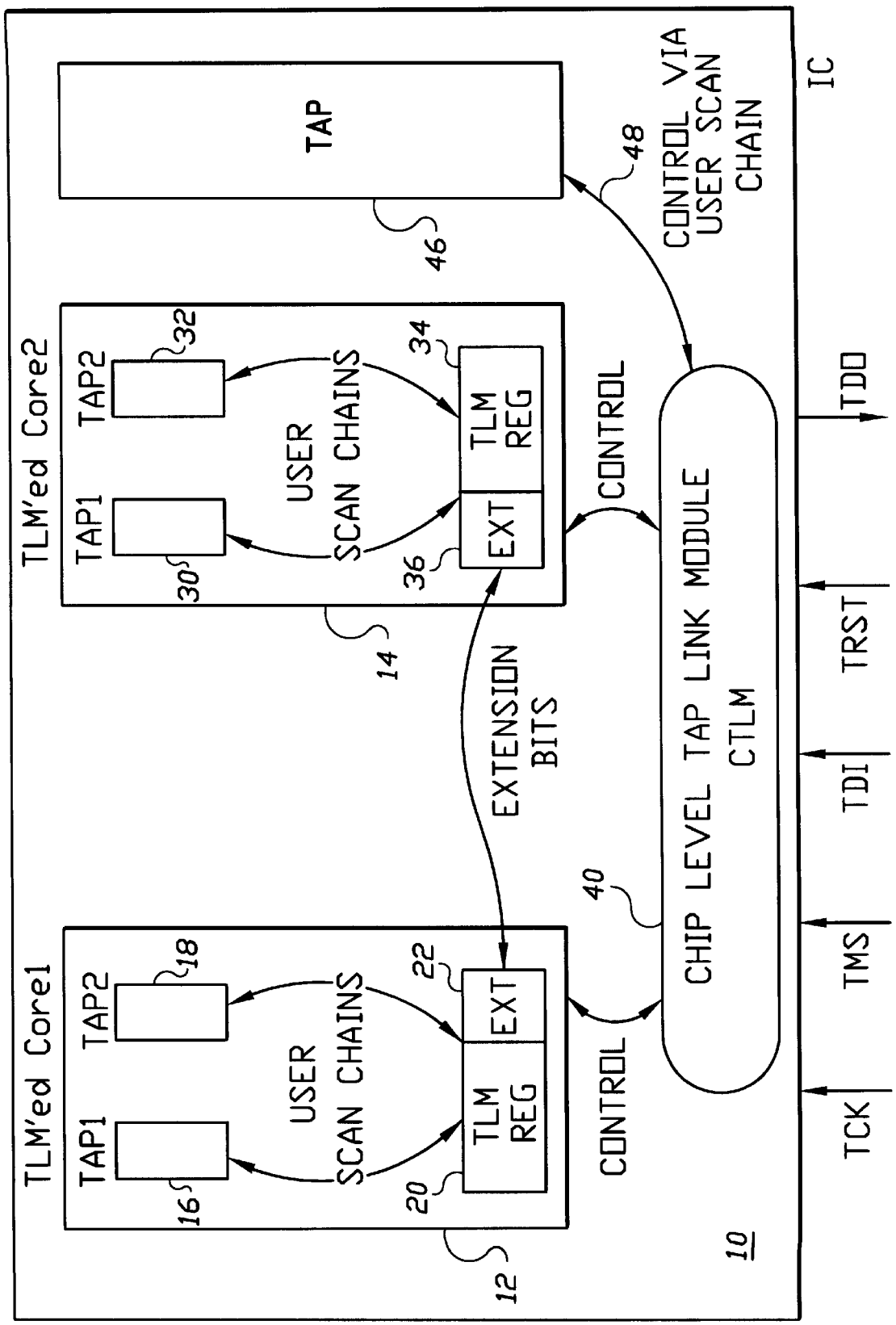
FIG. 1 is a diagram of a circuit control arrangement used to illustrate an example embodiment of an IC having multiple TLM'ed cores, according to the present invention.

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention may be applied to a variety of integrated circuit (IC) designs that have two or more internal core circuits controlled via internal TLMs and that require or benefit control or coordination during a test/debug stage. The present invention has been found to be particularly advantageous for use in connection with ICs having two or more TLM'ed CPU cores, such the VVS3670 Multicore Development Chip, which includes the ARM and OAK DSP processors (available from VLSI Technology, Inc. of San Jose, Calif.). While the present invention is not so limited, an appreciation of various aspects of the invention may be obtained through a discussion of various application examples in such environments.

According to an example embodiment, the present invention provides a circuit control arrangement including a chip-level TAP link module and multiple TLM'ed core circuits, and each TLM'ed core circuit has multiple test-access port (TAP) controllers and an internal TAP link module. The TLM includes a storage unit having a TLM register adapted to store a decodable instruction and having a supplemental storage circuit adapted to store a coded signal. Each TLM'ed core circuit accesses the chip-level TAP link module using the storage unit, and the chip-level TLM and the multiple cores are adapted to use the supplemental storage circuit to indicate when an instruction is being passed to the chip-level TLM in the next data loop.

In a more specific implementation, the chip-level TLM is a separate functional block implemented with selective output circuitry to control and provide smooth switching between outputs of active cores in the same IC, and at least one selected core includes an external scan-chain support. The external scan-chain support is used by a TAP controller in the selected core to access the chip-level TLM. External scan-chain support is conventional on most re-usable CPU cores, and this aspect functions in at least one TAP controller as is described in connection with the above-referenced U.S. patent application Ser. No. 08/283,171 (VLSI.228PA).

Turning now to the figures, FIG. 1 illustrates another specific example embodiment of the present invention. This embodiment includes a circuit control arrangement 10 used in a multiple TLM'ed core IC, with each core 12 or 14 having multiple test-access port (TAP) controllers and, within a TLM, a two-part storage register. The core 12 includes TAP controllers 16 and 18 and a two-part storage register with TLM register 20 adapted to store a decodable instruction and with a cell 22 for a supplemental extension bit. Similarly, the core 14 includes TAP controllers 30 and 32 and two-part storage register with TLM register 34 also adapted to store a decodable instruction and with a cell 26 for a supplemental extension bit. The skilled artisan will appreciate that such a storage circuit can be implemented as a register or other (multi-)bit holding arrangement in a number of forms including, for example, memory cell, flip-flop, latch, and a combination of such circuits.

A chip-level TLM 40 communicates with a common IEEE JTAG 1149.1 interface and with each of the multiple cores via the associated TLM register and two-part storage register. In accordance with certain embodiments of the present invention, the chip-level TLM 40 is also capable of using control signals to transfer control between the multiple cores. To accommodate this implementation, a TLM internal to one of the TLM'ed cores includes a storage unit that has both a TLM register adapted to store a decodable instruction, and a supplemental storage circuit adapted to store a coded signal. Control between the chip-level TLM and the cores 12 and 14 can be implemented, for example, using conventional IEEE JTAG 1149.1 signals, such as TMS, Capture, Shift and Update clock signals. In this specification, Capture clock is used to sample data in scan cells and is generated in a CAPTURE-DR state of the TAP state machine. Shift clock is used to shift data in scan cells and is generated in a SHIFT-DR state of the TAP state machine. Update clock is used to update the instruction register in the TLM 16 and is generated in an UPDATE-DR state of the TAP state machine.

In another example embodiment, each of the TAP controllers communicates with the chip-level TLM using such conventional control signals, and the TAP controllers operate as conventional TAP state machines, as defined in the IEEE JTAG 1149.1 specification. For example, when the TAP controller is in the UPDATE-DR state, the output of the TAP controller's data registers are latched to prevent changes at the parallel output while data is shifted in the associated shift-register path in response to certain instructions being received by the TAP controller. Further, in the UPDATE-DR state, the current instruction is not permitted to be changed until after this state is exited, which is upon the rising edge of TCK where the TAP controller enters either the select DR-Scan state if the TMS signal is held at 1 or the Run-Test/Idle state if the TMS signal is held at 0. These states and transitions are as characterized in IEEE Std. 1149.1-1990, and 1149.1-1993 (fully incorporated herein), and chapter five therein explains the operation of the TAP controller and illustrates the state machine for such a TAP controller. In this regard, reference may also be made to the above-referenced U.S. patent application Ser. No. 09/283,809 (VLSI.206PA).

Figure 2:
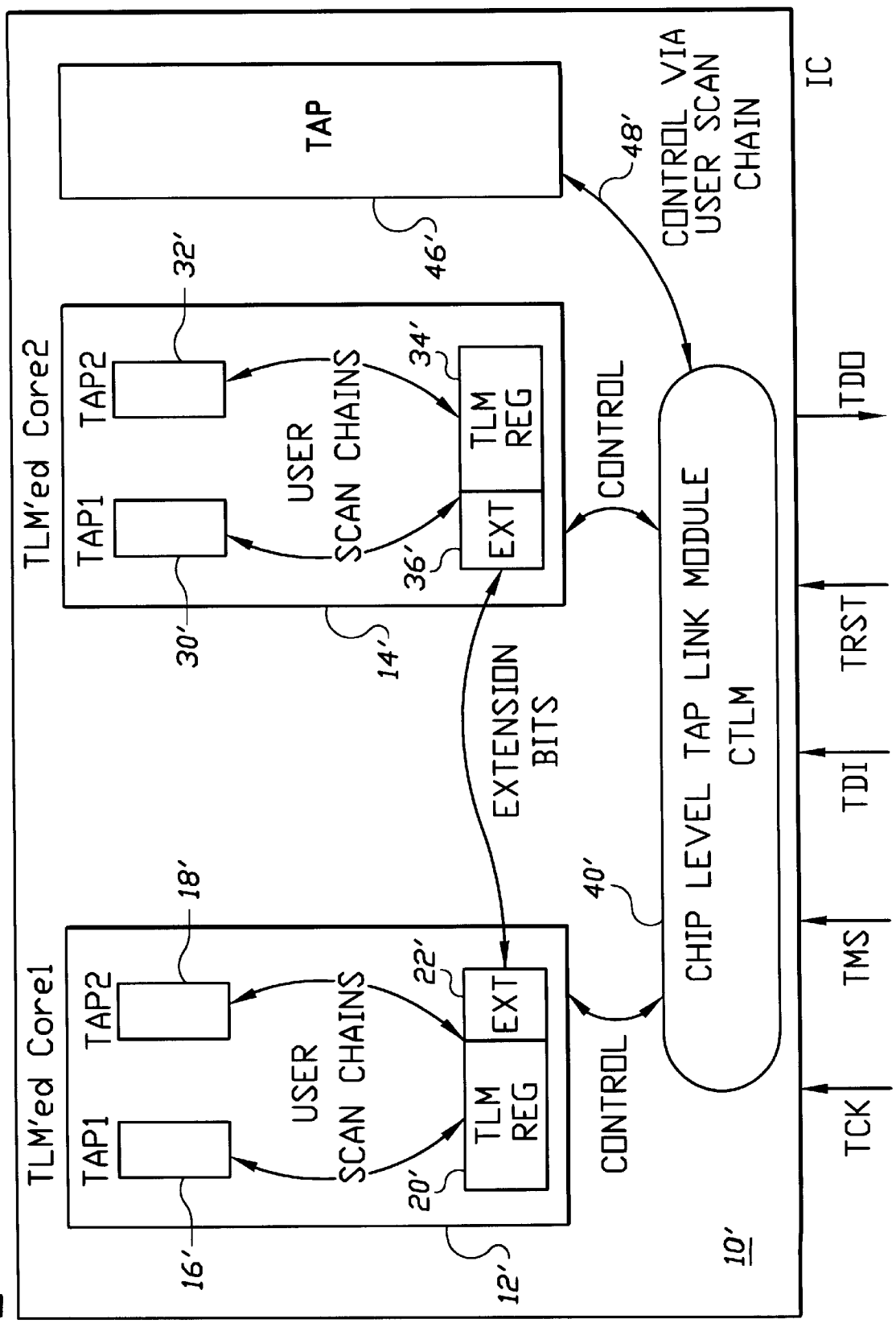
FIG. 2 is a diagram of a circuit control arrangement used to illustrate another example embodiment of an IC having multiple TLM'ed cores, according to the present invention.

In the example embodiment illustrated in FIG. 2, a multi-core IC in an arrangement 10' is identical to the arrangement 10 of FIG. 1 but one of the cores 46 has only one test-access port (TAP) controller and, therefore, no such TLM with a two-part storage register. The core 46 can access the chip-level TLM 40 using a scan-chain support, for example, as described in connection with the above-referenced U.S. patent application Ser. No. 09/283,171 (VLSI.228PA). Thus, the chip-level TLM can be expanded to enable a mixture of multiple TLM'ed cores and individual TAPs at the same time or one at a time, to any level of hierarchy.

Accordingly, in the arrangement 10' of FIG. 2, the cores 12 and 14 access the chip-level TLM 40 using the TMS, CAPTURE, SHIFT and UPDATE signals while the core 46 access the chip-level TLM 40 using scan-chain support, all of which are as characterized and used in the discussion of the IEEE JTAG recommendation.

With either the arrangement 10 of FIG. 1 or the arrangement 10' of FIG. 2, the chip-level TLM and the multiple TLM'ed cores can use the supplemental storage circuit, or extension bit as in the illustrated example, to transfer instructions for control between the multiple cores. In one example application, this extension bit is used to set a coded signal that is used to transfer an instruction via the chip-level TLM to select (or activate) another TLM'ed core, for example, a TLM'd core at a higher level.

In an example process for this control application, the extension bit has a special function and its use can be appreciated with reference to the arrangement 10 of FIG. 1 in the example process that follows.

The process begins, for example, at reset time when the internal TLM for the core 12 is active and the TAP controller 16 within it is enabled. Sometime after reset, the internal TLM for the core 14 is to be enabled and the internal TLM for the core 12 disabled. For this scenario, the TAP controller 16 selects the TLM register 20 and shifts in a value that sets the extension bit at 22. Since this extension bit is set, the TDI and TDO signals to the IC are now connected between the chip-level TLM 40 and the internal TLM for the core 12. In the next data loop, a command is shifted in the register internal to the chip-level TLM. At the end of the Update DR state for the TAP controller 16, the extension bit at 22 is cleared unconditionally. The new command thus shifted into the chip-level TLM 40 forces the TMS signal provided to the core 12 low, in turn forcing the TAP controllers 16 and 18 of the TLM'ed core 12 into IDLE state. At the same time, the TMS signal provided to the TLM'ed core 14 is enabled.

Accordingly, the present invention provide, among other aspects, an elegant method to expand TLM'ed cores uniformly and hierarchically without changing the IEEE JTAG 1149.1 specification and without requiring more scan chains for each TAP'ed core.

The various embodiments described above are provided by way of illustration only and are not intended to limit the invention. Those skilled in the art will readily recognize various modifications and changes that may be made to the present invention. For example, it is apparent that the circuits are depicted as functional operators and can be implemented using various structures including those listed above and in connection with the concurrently-filed patent documents, and that each block is readily implemented using conventional circuits and implementation tools, including but not limited to HDL approaches and programmed microprocessor approaches. Further, it will be appreciated that illustrating only one or two cores of each type shown in the figures is not limiting. Changes such as these that do not strictly follow the example embodiments and applications illustrated and described herein do not depart from the scope of the present invention, which is set forth in the following claims.

What is claimed is:

1. A multi-core IC having a limited number of access pins for selecting functions internal to the IC, comprising:
multiple cores within the IC, each of the multiple cores including multiple test-access port (TAP) controllers and including an internal TLM, wherein the TLM includes a storage unit having a TLM register adapted to store a decodable instruction and a supplemental storage circuit adapted to store a coded signal; and
a chip-level TLM communicatively coupled with a common interface and with each of the multiple cores via the TLM register and the supplemental storage circuit, wherein the chip-level TLM and the multiple cores are configured and arranged to use the supplemental storage circuit for transferring an instruction from one of the multiple cores.

2. A multi-core IC, according to claim 1, wherein the supplemental storage circuit is an extension bit circuit.

3. A multi-core IC, according to claim 1, wherein the supplemental storage circuit is an extension bit and accessed simultaneously with the TLM register.

4. A multi-core IC, according to claim 1, wherein within one of the multiple cores, a selected one of the TAP controllers is adapted to select the TLM register and cause a coded signal to be stored in the supplemental storage circuit, and wherein the chip level TLM responds by coupling data from the selected one of the TAP controllers to an output port of the IC.

5. A multi-core IC, according to claim 1, wherein the chip-level TLM enables only one of the multiple cores to the common interface.

6. A multi-core IC, according to claim 1, wherein the chip-level TLM enables at least two of the multiple cores to the common interface.

7. A multi-core IC, according to claim 1, wherein the common interface is compliant with an IEEE JTAG interface recommendation.

8. A multi-core IC, according to claim 1, further including a scan chain control arrangement, and wherein, within each of the multiple cores, the TAP controllers are configured and arranged to access the internal TLM via the scan chain control arrangement.

9. In the multi-core IC of claim 1, a process of transferring control between selected ones of the multiple cores, the process including: selecting the TLM register and causing a coded signal to be stored in the supplemental storage circuit, and in response coupling data from a selected one of the TAP controllers to an output port of the IC.

10. A multiple logic unit IC having a limited number of access pins for selecting functions internal to the IC, comprising:

multiple logic units within the IC, each of the multiple logic units including multiple means for controlling a test-access port (TAP) and including an internal TLM, wherein the TLM includes means for storing having a decodable instruction and a supplemental coded signal; and means, communicatively coupled with a common interface and with each of the multiple logic units, for controlling the IC via said means for storing, wherein the means for controlling the IC and the multiple means are configured and arranged to use the supplemental coded signal storage circuit for transferring an instruction from one of the multiple logic units.

11. A multi-core IC having a limited number of access pins for selecting functions internal to the IC, comprising:

multiple cores within the IC, each of the multiple cores including multiple test-access port (TAP) controllers and including an internal TLM, wherein the TLM includes a storage unit having a TLM register adapted to store a decodable instruction and an extension storage circuit adapted to store a coded bit; and a chip-level TLM communicatively coupled with a common interface and with each of the multiple cores via the TLM register and the extension storage circuit, wherein the chip-level TLM and the multiple cores are configured and arranged to use the extension storage circuit for indicating when an instruction is to be transferred from a selected one of the multiple cores, wherein the chip level TLM is adapted to load data into the storage unit and, within each of the multiple cores, the chip level TLM responds to the loaded data by coupling and controlling a TMS signal.

12. A multi-core IC, according to claim 11, wherein within one of the multiple cores, a selected one of the TAP controllers is adapted to select the TLM register and cause a coded signal to be stored in the extension storage circuit, and wherein the chip level TLM responds by coupling data from the selected one of the TAP controllers to an output port of the IC.

13. A multi-core IC, according to claim 12, wherein the chip-level TLM enables at least two of the multiple cores to the common interface.

14. A multi-core IC, according to claim 13, wherein the common interface and each of the TAP controllers is compliant with an IEEE JTAG interface recommendation.

15. A multi-core IC, according to claim 11, wherein the common interface and each of the TAP controllers is compliant with an IEEE JTAG interface recommendation.

16. A multi-core IC, according to claim 15, further including a scan chain control arrangement, and wherein, within each of the multiple cores, the TAP controllers are configured and arranged to access the internal TLM via the scan chain control arrangement.

17. In the multi-core IC of claim 16, a process of transferring control between selected ones of the multiple cores, the process including: selecting the TLM register and causing a coded signal to be stored in the extension storage circuit, and in response coupling data from a selected one of the TAP controllers to an output port of the IC.

18. In the multi-core IC of claim 11, a process of transferring control between selected ones of the multiple cores, the process including: selecting the TLM register and causing a coded signal to be stored in the extension storage circuit, and in response coupling data from a selected one of the TAP controllers to an output port of the IC.

19. A multi-core IC having a limited number of access pins for selecting functions internal to the IC, comprising:

multiple cores within the IC, each of the multiple cores including at least one test-access port (TAP) controller;

at least one of the multiple cores including multiple test-access port (TAP) controllers and an internal TLM, wherein the internal TLM includes a storage unit having a TLM register adapted to store a decodable instruction and a supplemental storage circuit adapted to store a coded signal; and a chip-level TLM communicatively coupled with a common interface and with each of the multiple cores via the TLM register and the supplemental storage circuit, wherein the chip-level TLM is configured and arranged to use the supplemental storage circuit to determine whether the chip-level TLM will be receiving an instruction.

20. A multi-core IC, according to claim 19, wherein at least one of the multiple cores includes a scan-chain support circuit and wherein the chip-level TLM is further configured and arranged to use the scan-chain support circuit for transferring control between the multiple cores.

* * * * *

UNITED STATES PATENT AND TRADEMARK OFFICE
CERTIFICATE OF CORRECTION

PATENT NO.      : 6,311,302 B1
DATED           : October 30, 2001
INVENTOR(S)     : Cassetti et al.

Page 1 of 1

It is certified that error appears in the above-identified patent and that said Letters Patent is hereby corrected as shown below:

<u>Column 4,</u>
Line 35, "Ser. No. 08/283,171" should read -- Ser. No. 09/283,171 --.

Signed and Sealed this

Twenty-first Day of May, 2002

Attest:

Attesting Officer

JAMES E. ROGAN
*Director of the United States Patent and Trademark Office*